(12) United States Patent
Bergbauer et al.

(10) Patent No.: US 10,720,549 B2
(45) Date of Patent: Jul. 21, 2020

(54) SEMICONDUCTOR LAYER SEQUENCE HAVING PRE- AND POST-BARRIER LAYERS AND QUANTUM WELLS

(71) Applicant: OSRAM OLED GmbH, Regensburg (DE)

(72) Inventors: Werner Bergbauer, Windberg (DE); Joachim Hertkorn, Wörth an der Donau (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/319,454

(22) PCT Filed: Sep. 4, 2017

(86) PCT No.: PCT/EP2017/072083
§ 371 (c)(1),
(2) Date: Jan. 21, 2019

(87) PCT Pub. No.: WO2018/050466
PCT Pub. Date: Mar. 22, 2018

(65) Prior Publication Data
US 2019/0267511 A1    Aug. 29, 2019

(30) Foreign Application Priority Data
Sep. 16, 2016 (DE) .................... 10 2016 117 477

(51) Int. Cl.
*H01L 33/02*      (2010.01)
*H01L 33/14*      (2010.01)
(Continued)

(52) U.S. Cl.
CPC ........... *H01L 33/06* (2013.01); *H01L 33/025* (2013.01); *H01L 33/145* (2013.01); *H01L 33/32* (2013.01);
(Continued)

(58) Field of Classification Search
CPC ..... H01L 33/025; H01L 33/145; H01L 33/32; H01L 33/06; H01S 5/3407; H01S 5/3408; H01S 5/34333
See application file for complete search history.

(56) References Cited

U.S. PATENT DOCUMENTS 5,467,364 A * 11/1995 Muro .................... B82Y 20/00
                                                  372/45.01
5,583,878 A * 12/1996 Shimizu ................. B82Y 20/00
                                                  372/45.01
(Continued)

FOREIGN PATENT DOCUMENTS

DE      102009015569 A1    10/2010
EP         1667292 A1     6/2006
(Continued)

*Primary Examiner* — Ida M Soward
(74) *Attorney, Agent, or Firm* — Slater Matsil, LLP

(57) ABSTRACT

In an embodiment a semiconductor layer sequence includes a pre-barrier layer including AlGaN, a pre-quantum well including InGaN having a first band gap, a multi-quantum well structure including a plurality of alternating main quantum wells of InGaN having a second band gap and main barrier layers of AlGaN or AlInGaN, wherein the second band gap is smaller than the first band gap and the main quantum wells are configured to generate a radiation having a wavelength of maximum intensity between 365 nm and 490 nm inclusive, a post-quantum well with a third band gap which is larger than the second band gap, a post-barrier layer including AlGaN or AlInGaN and an electron-blocking layer including AlGaN.

17 Claims, 2 Drawing Sheets

(51) Int. Cl.
*H01L 33/32* (2010.01)
*H01L 33/06* (2010.01)
*H01S 5/34* (2006.01)
*H01S 5/343* (2006.01)
*H01S 5/20* (2006.01)

(52) U.S. Cl.
CPC .......... *H01S 5/3407* (2013.01); *H01S 5/3408* (2013.01); *H01S 5/34333* (2013.01); *H01S 5/2009* (2013.01); *H01S 5/3425* (2013.01)

(56) References Cited

U.S. PATENT DOCUMENTS

| | | | |
|---|---|---|---|
| 5,929,462 A | 7/1999 | Kasukawa et al. | |
| 6,040,588 A * | 3/2000 | Koide | B82Y 20/00 257/15 |
| 6,154,475 A * | 11/2000 | Soref | B82Y 20/00 257/18 |
| 6,240,114 B1 * | 5/2001 | Anselm | B82Y 20/00 372/45.01 |
| 7,692,182 B2 | 4/2010 | Bergmann et al. | |
| 7,718,992 B2 * | 5/2010 | Won | B82Y 20/00 257/14 |
| 7,804,869 B2 * | 9/2010 | Freund | B82Y 20/00 372/43.01 |
| 8,143,614 B2 * | 3/2012 | Samal | B82Y 20/00 257/13 |
| 8,357,924 B2 | 1/2013 | Kim et al. | |
| 8,648,384 B2 * | 2/2014 | Na | H01L 33/06 257/101 |
| 8,908,733 B2 | 12/2014 | Avramescu et al. | |
| 8,975,616 B2 * | 3/2015 | Wang | B82Y 20/00 257/14 |
| 9,202,971 B2 | 12/2015 | Avramescu et al. | |
| 9,219,189 B2 | 12/2015 | Northrup et al. | |
| 9,236,531 B2 * | 1/2016 | Choi | H01L 33/32 |
| 9,373,748 B2 | 6/2016 | Park | H01L 33/06 |
| 9,711,682 B2 * | 7/2017 | Han | H01L 33/12 |
| 10,418,516 B2 * | 9/2019 | El-Ghoroury | H01L 33/32 |
| 2005/0056824 A1 | 3/2005 | Bergmann et al. | |
| 2008/0217632 A1 | 9/2008 | Tomiya et al. | |
| 2011/0104843 A1 * | 5/2011 | Jun | H01L 33/0075 438/45 |
| 2012/0037881 A1 | 2/2012 | Kim et al. | |
| 2012/0235116 A1 * | 9/2012 | Su | H01L 33/06 257/13 |
| 2013/0020553 A1 | 1/2013 | Han et al. | |
| 2013/0320299 A1 * | 12/2013 | Li | H01L 33/06 257/13 |
| 2015/0041760 A1 | 2/2015 | Han et al. | |
| 2017/0125632 A1 * | 5/2017 | Watabe | H01L 33/06 |
| 2019/0207059 A1 * | 7/2019 | Shur | H01L 33/007 |

FOREIGN PATENT DOCUMENTS

| | | |
|---|---|---|
| JP | 2012015535 A | 1/2012 |
| JP | 2012522390 A | 9/2012 |
| JP | 2013516781 A | 5/2013 |
| JP | 2015511776 A | 4/2015 |
| KR | 1020060114683 A | 11/2006 |
| KR | 1020130096991 A | 9/2013 |
| KR | 20160013552 A | 2/2016 |
| WO | 2016002419 A1 | 1/2016 |

* cited by examiner

SEMICONDUCTOR LAYER SEQUENCE HAVING PRE- AND POST-BARRIER LAYERS AND QUANTUM WELLS

This patent application is a national phase filing under section 371 of PCT/EP2017/072083, filed Sep. 4, 2017, which claims the priority of German patent application 102016117477.7, filed Sep. 16, 2016, each of which is incorporated herein by reference in its entirety.

TECHNICAL FIELD

The invention relates to a semiconductor layer sequence.

SUMMARY OF THE INVENTION

According to at least one embodiment, the semiconductor layer sequence is based on AlInGaN. This means that the individual layers of the semiconductor layer sequence are composed of $Al_xIn_yGa_{1-x-y}N$, wherein $0 \leq x \leq 1$, $0 \leq y \leq 1$ and $0 \leq x+y < 1$. Dopants such as silicon or magnesium can additionally be present. For the sake of simplicity, however, only the essential components of the crystal lattice of the semiconductor layer sequence are mentioned, that is Al, In, Ga and N, even if these can be replaced by small quantities of other elements. In particular, impurities or admixtures are not taken into account if they make up a proportion on AlInGaN of at most 0.1% by mass.

According to at least one embodiment, the semiconductor layer sequence comprises a pre-barrier layer. The pre-barrier layer is composed of AlGaN. An aluminum content of the pre-barrier layer is preferably at least 2% or 20% and/or at most 50% or 40% or 30%. In particular, the aluminum content is between 20% and 30% inclusive. The pre-barrier layer is preferably free of indium. In this context, the percentages indicate the indices x, y in $Al_xIn_yGa_{1-x-y}N$. An aluminum content of, for example, 30% means that x=0.30. The same applies to y for the indium content.

Optionally, it is possible for the pre-barrier layer to have small amounts of indium and thus to be composed of $Al_xIn_yGa_{1-x-y}N$. In this case, the above-mentioned values for aluminum in the case of an AlGaN prebarrier layer apply in the same way. The indium content is preferably at most 1% or 0.5% or 0.2%.

According to at least one embodiment, the pre-barrier layer has a thickness of at least 1 nm or 2.5 nm and/or of at most 4 nm or 10 nm. In particular, the thickness of the preliminary barrier layer is between 2.5 nm and 3.5 nm inclusive.

According to at least one embodiment, the semiconductor layer sequence comprises a pre-quantum well. The pre-quantum well is formed from InGaN. The pre-quantum well has a first band gap, which can be assigned to a first emission energy. It is possible for the pre-quantum well not to be designed for generating radiation when the semiconductor layer sequence is used as intended. In other words, in this case, no radiation is generated in the pre-quantum well when the semiconductor layer sequence is used as intended or no significant radiation proportion is generated and the pre-quantum well can be referred to as a dark quantum well. Alternatively, it is possible for the pre-quantum well to contribute to the generation of radiation, for example, at a different wavelength than the main quantum wells.

According to at least one embodiment, the pre-quantum well has an indium content of at least 0.2% or 1% or 2% or is alternatively free of indium. Alternatively or additionally, the indium content of the pre-quantum well is at most 6% or 15%. In particular, the indium content is between 4% and 5.5% inclusive. The pre-quantum well is particularly preferably free of aluminum.

According to at least one embodiment, the pre-quantum well has a thickness of at least 1.5 nm or 2.2 nm and/or of at most 5 nm or 3.4 nm. In particular, the thickness of the pre-quantum well is between 2.4 nm and 2.8 nm inclusive.

According to at least one embodiment, the semiconductor layer sequence comprises a multi-quantum well structure. The multi-quantum well structure comprises a plurality of alternating main quantum wells and main barrier layers. In this case, the main quantum wells are preferably formed from InGaN and the main barrier layers are preferably formed from AlGaN or AlInGaN. The main quantum wells have a second band gap corresponding to a second emission energy, which is greater than or equal to the first band gap of the pre-quantum well. The main quantum wells are designed to generate a radiation having a wavelength of maximum intensity of at least 365 nm or 375 nm or 385 nm and/or of at most 490 nm or 410 nm or 395 nm.

According to at least one embodiment, an indium content of the main quantum wells is at least 0.2% or 2% or 4%, or the main quantum wells are alternatively free of indium. Alternatively or additionally, the indium content of the main quantum wells is at most 5% or 15%. In particular, the indium content of the main quantum wells is between 5% and 6.5% inclusive. The main quantum wells are particularly preferably free of aluminum.

According to at least one embodiment, the main quantum wells have a thickness of at least 1.5 nm or 2.2 nm and/or of at most 5 nm or 3.4 nm. In particular, the thickness of the main quantum wells is between 2.4 nm and 2.8 nm inclusive.

According to at least one embodiment, the main barrier layers have an aluminum content of at least 2% or 10% and/or of at most 20% or 30%. In particular, the aluminum content of the main barrier layers is between 12% and 18% inclusive. The main barrier layers are preferably free of indium, but can also have a low indium content of at most 1% or 0.5% or 0.2%.

According to at least one embodiment, the main barrier layers have a thickness of at least 0.5 nm or 0.9 nm and/or of at most 5 nm or 2.3 nm. In particular, the thickness of the main barrier layers is between 1.5 nm and 2 nm inclusive.

According to at least one embodiment, the semiconductor layer sequence comprises an electron blocking layer. The electron-blocking layer is formed from AlGaN and can be free of indium or have a small indium content, for example, at most 0.5% or 1% or 2%. A thickness of the electron-blocking layer is preferably at least 6 nm or 8 nm or 10 nm and/or at most 20 nm or 15 nm or 12 nm. Furthermore, an aluminum content or an average aluminum content of the electron-blocking layer is preferably at least 15% or 20% or 30% and/or at most 80% or 70% or 60%.

According to at least one embodiment, a product of the aluminum content and the thickness of the pre-barrier layer is greater by at least a factor of 1.3 than a product of the aluminum content and the thickness of the main barrier layers or of the closest main barrier layer. This factor is preferably at least 1.5 or 2 or 2.5 or 3. Furthermore, it is possible that this factor is at most 7 or 5 or 4.

In at least one embodiment, the semiconductor layer sequence is based on AlInGaN and is configured for an optoelectronic semiconductor chip, in particular a light-emitting diode or a laser diode. The semiconductor layer sequence has the following layers in the specified order, coming from an n-conducting n-side: a pre-barrier layer made of AlGaN, a pre-quantum well made of InGaN having a first band gap, a multi-quantum well structure comprising a plurality of alternating main quantum wells made of InGaN having a second band gap and main barrier layers made of AlGaN or AlInGaN, wherein the second band gap is larger than the first band gap or equal to the first band gap and the main quantum wells are configured for generating a radiation having a wavelength of maximum intensity between 365 nm and 490 nm inclusive, and an electron-blocking layer made of AlGaN, wherein a product of an aluminum content and a thickness of the pre-barrier layer is greater by at least a factor of 1.3 than a product of an aluminum content and a thickness of the main barrier layers or of the closest main barrier layer.

Especially for light-emitting diodes for the UVA spectral range, an excessively high aluminum content and simultaneously a reduced indium content in the optically active layers, in particular in the quantum films or quantum wells, leads to tensile-stressed layer stacks. This can lead, for example, to crack formation and thus to quality problems, in particular in the case of substrate-less thin-film light-emitting diodes.

Furthermore, it is to be noted that a charge carrier transport and a charge carrier capture at the quantum wells must be set by adding aluminum in the barriers between the quantum wells. Excessively high aluminum concentrations have a disadvantageous effect on a homogeneous charge carrier distribution in the multi-quantum well structure. If the aluminum content is too low, in particular at high current densities and at higher temperatures, non-radiative losses increase due to an excessively low charge carrier trapping rate. In this case, it is possible for both electrons and holes to leave the multi-quantum well structure to subsequently recombine non-radiatively in adjacent layers.

The semiconductor layer sequence described here has a combination of the pre-barrier layer and the pre-quantum well and preferably also of a post-barrier layer and a post-quantum well. The pre-barrier layer, the post-barrier layer, the pre-quantum well and the post-quantum well are located in the direct vicinity of the multi-quantum well structure. Due to the higher aluminum content and/or the larger thickness of the pre-barrier layer and/or the post-barrier layer, transition energies, corresponding to band gaps, of directly adjacent quantum wells would be energetically lower due to piezoelectric fields, which would lead to a non-uniform charge carrier distribution within the quantum wells.

On account of this, in the case of the semiconductor layer sequence described here, the pre-quantum wells and post-quantum wells which are directly adjacent to the multi-quantum well structure and to the pre-barrier layer and the post-barrier layer are grown with less indium and/or a lower layer thickness. Alternatively, in the case of a suitably large piezoelectric effect, the pre-quantum wells and post-quantum wells can also be thinner at a comparable indium content. In addition, the main barrier layers between the main quantum wells have a smaller thickness and/or a lower aluminum content than the pre-barrier layer and the post-barrier layer.

According to at least one embodiment, an indium content and/or a thickness of the pre-quantum well is smaller than an indium content and/or a thickness of the main quantum wells. For example, the indium content and/or the thickness differ from each other by at least 5% or 10% and/or by at most 40% or 25%, based on the thickness and/or the indium content of the main quantum wells.

According to at least one embodiment, a post-quantum well adjoins the multi-quantum well structure in the direction away from the n-side. The post-quantum well has a third band gap which is smaller than the second band gap of the main quantum wells. The post-quantum well can be designed in exactly the same way as the pre-quantum well so that the third band gap can be equal to the first band gap. The above statements with regard to thickness, indium content and aluminum content applicable to the pre-quantum well therefore apply in the same way to the post-quantum well. Alternatively, it is possible for the pre-quantum well and the post-quantum well to be designed differently from one another.

In particular, the post-quantum well is free of aluminum and the indium content thereof is at least 0.2% or 1% and/or at most 6% or 15% or is free of indium. In particular, the indium content is between 4% and 5.5% inclusive. For example, the post-quantum well has a thickness of at least 1.5 nm or 2.2 nm and/or of at most 5 nm or 3.4 nm. In particular, the thickness of the pre-quantum well is between 2.4 nm and 2.8 nm inclusive.

According to at least one embodiment, the multi-quantum well structure is followed by a post-barrier layer in the direction away from the n-side. The post-barrier layer is produced from AlGaN or AlInGaN. The post-barrier layer can be designed in the same way as the pre-barrier layer. The above-mentioned explanations with regard to thickness, composition and band gap applicable to the pre-barrier layer preferably apply in the same way to the post-barrier layer. The post-barrier layer preferably follows the post-quantum well so that the post-quantum well is located between the multi-quantum well structure and the post-barrier layer.

According to at least one embodiment, the electron-blocking layer follows the post-barrier layer in the direction away from the n-side. The electron-blocking layer for electrons has preferably a thickness which is greater by at least a factor of 1.5 or 2 or 3 and/or by at most a factor of 10 or 6 or 4 than the post-barrier layer. Preferably, the barrier height of the electron blocking layer is also at least equal, particularly preferably by at least a factor of 1.25 or 1.5 or 2 higher than that of the post-barrier layer. In other words, the electron-blocking layer blocks electrons more strongly than the post-barrier layer.

According to at least one embodiment, a spacer layer is located between the electron-blocking layer and the post-barrier layer. The spacer layer preferably directly adjoins the electron-blocking layer and/or the post-barrier layer. The spacer layer is made of GaN or InGaN or AlGaN or AlInGaN. Preferably, a thickness of the spacer layer is at least 5 nm or 8 nm and/or at most 20 nm or 15 nm or 12 nm. The aluminum content of the spacer layer is preferably at most 5% or 2% or 0.5%, or the spacer layer is free of aluminum. An indium content of the spacer layer is preferably at most 5% or 2% or 1% and/or at least 0.5% or 1%; alternatively, the spacer layer is free of indium.

According to at least one embodiment, the electron-blocking layer is of multi-stage design. Alternatively, it is possible for the electron blocking layer to be composed of a plurality of partial layers spaced apart from one another. An aluminum content or an average aluminum content of the electron-blocking layer is preferably at least 15%. It is possible that, in the direction away from the n-side, the aluminum content in the partial layers of the electron-blocking layer or for the electron-blocking layer decreases monotonically or strictly monotonically as viewed overall.

According to at least one embodiment, the aluminum content within the pre-barrier layer and/or the main barrier layers and/or the post-barrier layer is constant, in particular within the scope of manufacturing tolerances. Alternatively or additionally, it is possible for the indium content in the pre-quantum well, the main quantum wells and the post-quantum well to be constant, again within the scope of the production tolerances.

According to at least one embodiment, a conditioning layer is located on one or on both sides of the pre-quantum well. A thickness of the conditioning layer is preferably at least 0.1 nm or 1 nm and/or at most 5 nm or 2 nm, in particular between 1.6 nm and 2 nm. The conditioning layer is preferably based on GaN. Alternatively, it is possible for the conditioning layer to have small amounts of indium, for example, at most 2% or 1%, in particular between 0.1% and 0.3% inclusive. The conditioning layer can be free of aluminum.

Alternatively, it is possible for the conditioning layer to contain aluminum. The aluminum content of the conditioning layer is preferably at most 100% or 50% or 20% or 5% of the aluminum content of the closest main barrier layer.

According to at least one embodiment, one or two conditioning layers are each present directly on the main quantum wells. The conditioning layers on the main quantum wells can be designed in the same way as the conditioning layers at the pre-quantum well and/or at the post-quantum well. In contrast it is possible for the conditioning layers arranged at the pre-quantum well and/or at the post-quantum well to be designed differently than the conditioning layers on the main quantum wells.

According to at least one embodiment, a band gap jump between the main barrier layers and the adjoining pre-quantum well or the adjoining main quantum well is divided into two smaller jumps by means of the conditioning layers. The two smaller jumps can in each case be 50% of the larger total band gap jump. Alternatively, one of the two jumps is at least 25% or 35% or 40% and/or at most 45% or 40% of the total, larger band gap jump.

According to at least one embodiment, the conditioning layers or part of the conditioning layers have an indium gradient with an indium content increasing in the direction towards the adjoining pre-quantum well or main quantum well or post-quantum well. Alternatively or additionally, it is possible that an aluminum gradient is present with an aluminum content increasing in the direction away from the adjacent pre-quantum well or main quantum well or post-quantum well. By means of such gradients, an improved crystal quality can be achieved in the semiconductor layer sequence towards the quantum wells and/or improved electro-optical characteristics can be achieved.

According to at least one embodiment, the semiconductor layer sequence has exactly one pre-quantum well and/or exactly one post-quantum well. Alternatively, a plurality of pre-quantum wells and/or a plurality of post-quantum wells are provided. The number of pre-quantum wells and/or of post-quantum wells is preferably at most five or three.

According to at least one embodiment, in the multi-quantum well structure the semiconductor layer sequence has at least four or eight or twelve and/or at most 50 or 30 or 20 of the main quantum wells. The number of main quantum wells exceeds a sum of the number of pre-quantum wells and post-quantum wells preferably by at least a factor of 2 or 4 or 8.

According to at least one embodiment, all pairs of main barrier layers and main quantum wells and the optionally present conditioning layers in the multi-quantum well structure are of the same design. Alternatively, it is possible for the main barrier layers and the main quantum wells and optionally for the conditioning layers to be designed variably across the multi-quantum well structure.

According to at least one embodiment, the pre-barrier layer and optionally the post-barrier layer and the main barrier layers have the same aluminum content, in particular with a tolerance of at most 20% or 10% or 2% or within the production accuracies. In other words, only the thicknesses of the main barrier layers differ from the thicknesses of the pre-barrier layer and/or the post-barrier layer.

According to at least one embodiment, the second band gap of the main quantum wells is at least 70% or 80% or 85% and/or at most 95% or 90% or 85% of the first band gap of the pre-quantum well and/or of the post-quantum well. The main quantum wells preferably all have the same band gap within the scope of the production tolerances.

BRIEF DESCRIPTION OF THE DRAWINGS

A semiconductor layer sequence described here is explained in more detail below with reference to the drawing on the basis of exemplary embodiments. Identical reference signs indicate the same elements in the individual figures. However, no relationships to scale are illustrated, but rather individual elements can be represented with an exaggerated size in order to afford a better understanding.

In the figures.

DETAILED DESCRIPTION OF ILLUSTRATIVE EMBODIMENTS

Figure 1:
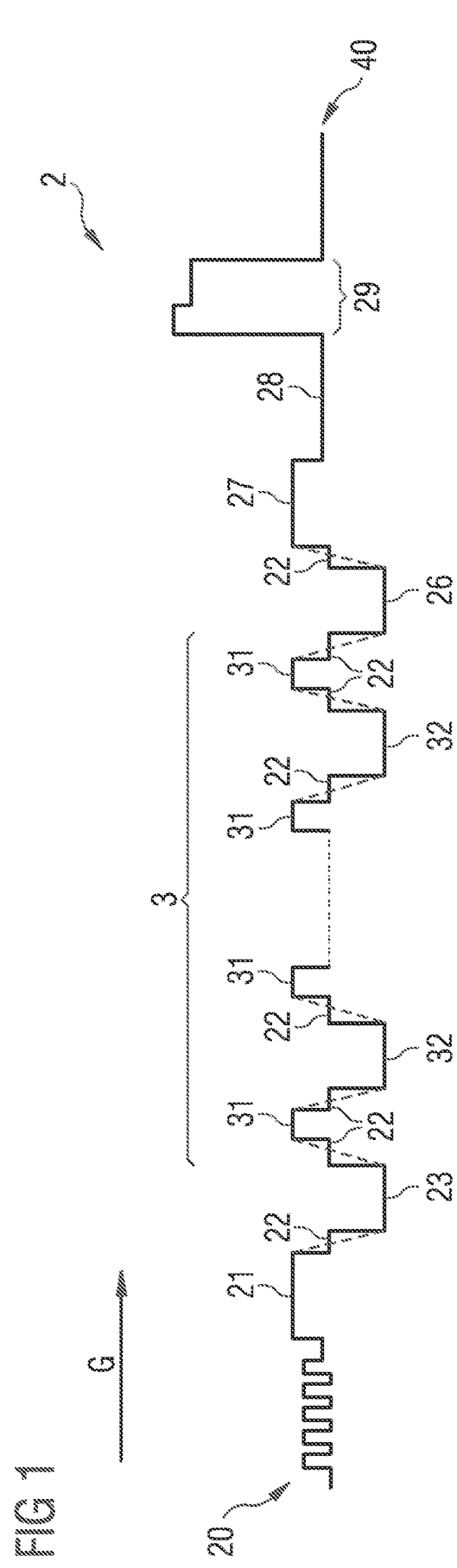
FIG. 1 shows a schematic illustration of a semiconductor layer sequence on the basis of a profile of a band gap.

FIG. 1 schematically illustrates an exemplary embodiment of a semiconductor layer sequence 2 on the basis of a profile of a band gap along a growth direction G. The growth direction G runs from an n-conducting n-side 20 to a p-conducting p-side 40.

Optionally, the semiconductor layer sequence 2 has, in front of a pre-barrier layer 21, a superlattice having alternating layers. Along the growth direction G, further layers such as buffer layers, nucleation layers or growth layers can precede the superlattice, wherein these layers are not illustrated in FIG. 1 in order to simplify the illustration.

A pre-barrier layer 21 serves as hole blocking layer. A thickness of the pre-barrier layer 21 is, for example, 2.9 nm. The pre-barrier layer 21 is composed of AlGaN having an aluminum content of 30%, i.e., $Al_{0.3}Ga_{0.7}N$.

The pre-barrier layer 21 is followed by a conditioning layer 22. The conditioning layer 22 is a thin layer of InGaN having a low indium content of 0.2%. A thickness of the conditioning layer 22 is 1.8 nm.

The conditioning layer is followed by a pre-quantum well 23 which is not primarily provided for generating radiation. The pre-quantum well 23 is composed of InGaN with an indium proportion of 5% and with a thickness of 2.6 nm.

The pre-quantum well 23 is followed by a multi-quantum well structure 3, which is provided for generating radiation, for example, for generating near ultraviolet radiation with a wavelength of maximum intensity between 390 nm and 395 nm inclusive. In the multi-quantum well structure 3, main barrier layers 31 and main quantum wells 32 alternate with one another.

Preferably, in each case one of the conditioning layers 22 is located between adjacent main barrier layers 31 and the associated main quantum wells 32. In this case, all the conditioning layers 22 can be identical to one another. The multi-quantum well structure 3 comprises, for example, 20 of the main quantum wells 32. Preferably, the multi-quantum well structure 3 begins and ends with one of the main barrier layers 31.

A band gap or emission energy of the main quantum wells 32 is smaller than or equal to a band gap or emission energy of the pre-quantum well 23.

As illustrated in FIG. 1 as a dashed line, the optionally present conditioning layers 22 can each have an indium gradient and/or an aluminum gradient so that the course of the band energy is oriented obliquely to the growth direction G in the conditioning layers 22, and thus a more uniform transition of the band gap from the associated barrier layers 21, 31, 27 towards the quantum wells 23, 32, 26 is possible. In particular, the conditioning layers 22 can be configured symmetrically with respect to the associated quantum well 23, 32, 26.

The main quantum wells 32 and the main barrier layers 31 within the multi-quantum well structure 3 are designed identically to one another. The main quantum wells 32 made of InGaN have, for example, a thickness of 2.6 nm and an indium content of 6%. A thickness of the AlGaN main barrier layers 31 is 1.7 nm and an aluminum content is 15%.

A post-quantum well 26 directly follows the last main barrier layer 31 and the associated conditioning layer 22. The post-quantum well 26 can be designed in exactly the same way as the pre-quantum well 23 and, for example, can have a thickness of 2.6 nm and an indium content of 5%. The conditioning layers 22 are also located on both sides of the post-quantum well 26.

The last one of the conditioning layers 22 or all of the conditioning layers 22 following the associated quantum wells 23, 32, 26 along the growth direction G can optionally be thicker and/or can have more indium than those of the conditioning layers 22 preceding the associated quantum wells 23, 32, 26, and, for example, can have an indium content of at least 1% and/or of at most 15% or 6% or be free of indium and can have a thickness of at least 1.5 nm or 2.2 nm and/or of at most 3.4 nm or 5 nm.

Particularly preferably, there is a post-barrier layer 27 along the growth direction G directly after the last conditioning layer 22 which follows the post quantum well 26. The post-barrier layer 27 is a barrier layer for electrons having a relatively low barrier height, compared with the subsequent electron blocking layer 29. For example, the post-barrier 27 is designed identically to the pre-barrier layer 21 or can also deviate from the pre-barrier layer 21. According to FIG. 1, the AlGaN post-barrier layer 27 has an aluminum content of 15% and a thickness of 2.9 nm.

A spacer layer 28 directly follows the post-barrier layer 27, the spacer layer 28 being composed of InGaN and being preferably free of aluminum and having a low indium content of, for example, at most 1%. The thickness of the spacer layer is 10 nm.

The spacer layer 28 is directly followed by the two-stage electron blocking layer 29. The thickness of the electron-blocking layer 29 is 11 nm in total. An average aluminum content in the electron-blocking layer 29 is 25%, wherein the aluminum content decreases in steps along the growth direction G.

The electron blocking layer 29 is followed by a p-doped GaN layer and a contact layer which can be formed from highly doped GaN.

The layers drawn in FIG. 1 preferably follow one another directly. Preferably, all of the drawn layers, optionally with the exception of the conditioning layers 22 and/or the electron-blocking layer 29, have a constant material composition. All layers arranged along the growth direction G preceding the multi-quantum well structure 3 are preferably n-doped and all subsequent layers are preferably p-doped. The multi-quantum well structure 3 can be doped or also undoped.

In the case of the semiconductor layer sequence described here, on account of in particular the pre-barrier layer 21 and the optional post-barrier layer 27, in particular in combination with the pre-quantum well 23 and/or the post-quantum well 26, the main barrier layers 31 are made thinner, as a result of which higher transparency can be achieved in the region of the multi-quantum well structure 3 for the generated radiation. Furthermore, significant advantages are evident at higher current densities, since the charge carriers can be better distributed over the main quantum wells 32. Nevertheless, the charge carriers are confined in the multi-quantum well structure by the pre-barrier layer and the post-barrier layer and leakage currents are prevented. Since the charge carriers, even at higher ambient temperatures, do not significantly escape from the multi-quantum well structure over the pre-barrier layer 21 and/or the post-barrier layer 27, improved temperature stability is achieved. This results in a highly efficient structure which can be adapted to the respectively desired emission wavelength of the main quantum wells 32 by the aluminum content and the thickness of the main barrier layers 31 and of the pre-barrier layer 21 and of the post-barrier layer 27.

Figure 2:
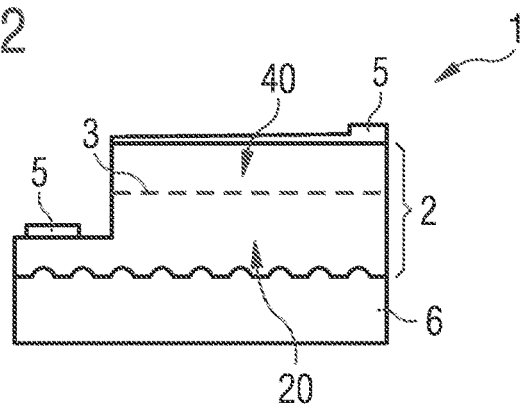
FIG. 2 shows a schematic sectional illustration of an exemplary embodiment of a semiconductor chip having a semiconductor layer sequence.

FIG. 2 illustrates an exemplary embodiment of an optoelectronic semiconductor chip 1 which has such a semiconductor layer sequence 2. The semiconductor layer sequence 2 is located on a substrate 6, which can be a growth substrate. For example, the substrate 6 is a sapphire substrate having a structured growth surface. The semiconductor layer sequence 2 can be electrically contacted via electrical contacts 5. Preferably, the semiconductor layer sequence 2 extends over the entire substrate 6 in a constant composition.

FIG. 3 illustrates a brightness L in arbitrary units as a function of a quotient Q. The quotient Q is specified in percent and corresponds to the thickness of the main barrier layers 31 divided by the thickness of the pre-barrier layer 21. According to FIG. 3, the thickness of the pre-barrier layer 21 is fixed at 3 nm, the thickness of the main barrier layers 31 is varied.

Figure 3A:
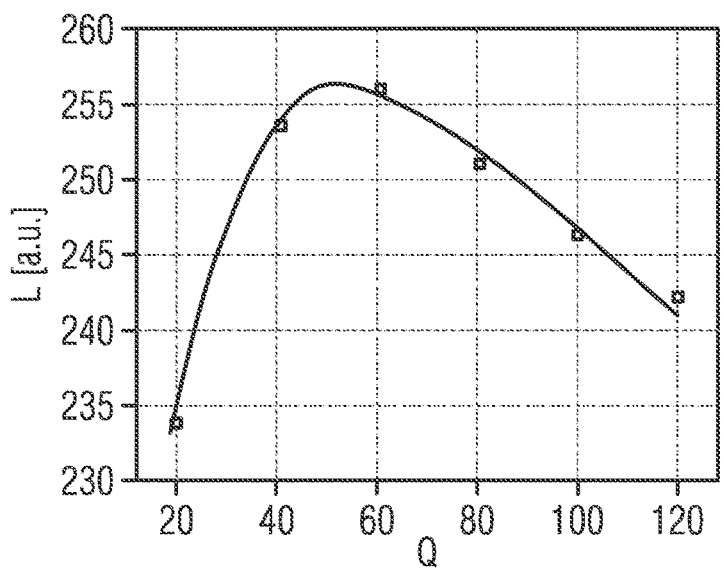
FIGS. 3A and 3B show schematic representations of a dependence of a brightness on a thickness ratio of the main barrier layers and of the pre-barrier layer of semiconductor layer sequences.
Figure 3B:
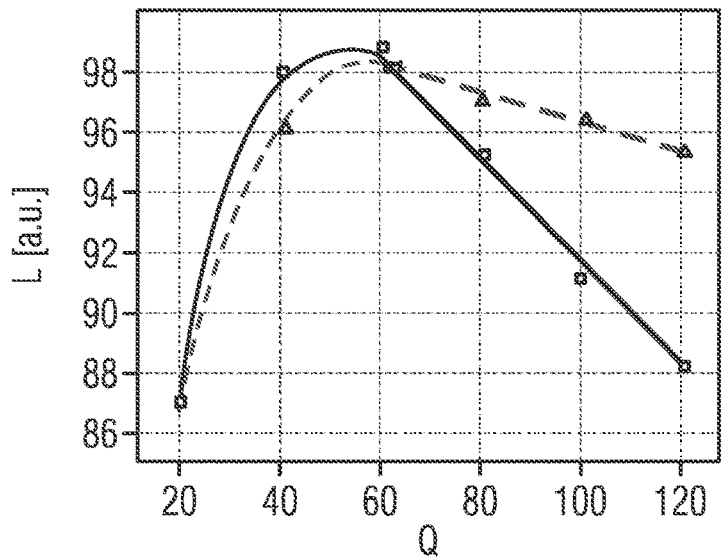

FIG. 3A shows a profile at a current of 1 A, in FIG. 3B at a current of 0.35 A (dashed line) and at a current of 1.5 A (solid line), in each case at a chip area of 1 $mm^2$.

It can be seen from FIGS. 3A and 3B that an optimum is achieved for a value of the quotient Q of 50% to 60%. This means that the pre-barrier layer 21 and preferably also the post-barrier layer 27 are approximately twice as thick as the main barrier layers 31. In particular, the thickness of the main barrier layers 31 is between 40% and 65% inclusive or between 45% and 60% inclusive of the thickness of the preliminary barrier layer 21.

It can also be seen from FIGS. 3A and 3B that the quotient Q for higher currents shows a more pronounced drop towards thicker main barrier layers 31. This means that improved efficiency can be achieved with the pre-barrier layers 21 and main barrier layers 31 described here, in particular at higher current densities.

The invention described here is not restricted by the description on the basis of the exemplary embodiments. Rather, the invention encompasses any new feature and also any combination of features which includes in particular any combination of features in the patent claims, even if this feature or this combination itself is not explicitly specified in the patent claims or exemplary embodiments.

The invention claimed is:

1. A semiconductor layer sequence comprising the following layers in the specified sequence beginning at an n-side:
   a pre-barrier layer comprising AlGaN;
   a pre-quantum well comprising InGaN having a first band gap;
   a multi-quantum well structure comprising a plurality of alternating main quantum wells of InGaN having a second band gap and main barrier layers of AlGaN or AlInGaN, wherein the second band gap is smaller than the first band gap and the main quantum wells are configured to generate a radiation having a wavelength of maximum intensity between 365 nm and 490 nm inclusive;
   a post-quantum well with a third band gap which is larger than the second band gap;
   a post-barrier layer comprising AlGaN or AlInGaN; and
   an electron-blocking layer comprising AlGaN, wherein a product of an aluminum content and a thickness of the pre-barrier layer and a product of an aluminum content and a thickness of the post-barrier layer are greater by at least a factor of 1.3 than a product of an aluminum content and a thickness of the main barrier layers.

2. The semiconductor layer sequence according to claim 1,
   wherein the wavelength of maximum intensity is between 365 nm and 395 nm inclusive,
   wherein the product of the aluminum content and the thickness of the pre-barrier layer is greater by at least a factor of 1.25 and by at most a factor of 5 than the product of the aluminum content and the thickness of the main barrier layers,
   wherein the pre-quantum well is not configured for generating radiation, and
   wherein an indium content and/or a thickness of the pre-quantum well is/are smaller than an indium content and/or a thickness of the main quantum wells.

3. The semiconductor layer sequence according to claim 1, wherein an aluminum content of the electron-blocking layer is at least 20% and a thickness of the electron-blocking layer is at least 8 nm and at most 15 nm.

4. The semiconductor layer sequence according to claim 1, wherein the electron-blocking layer is of multilayer fashion and the aluminum content of the electron-blocking layer decreases monotonically in a direction away from the n-side.

5. The semiconductor layer sequence according to claim 1,
   wherein, in a direction away from the n-side, the electron-blocking layer follows the post-barrier layer and a spacer layer of GaN or AlGaN or AlInGaN having a thickness of between 5 nm and 15 nm inclusive and an aluminum content of at most 5% and being located directly between the electron-blocking layer and the post-barrier layer,
   wherein the electron-blocking layer is a barrier for electrons that is thicker and/or higher by at least a factor of 1.5 than the post-barrier layer.

6. The semiconductor layer sequence according to claim 1, wherein the aluminum content within the pre-barrier layer, the main barrier layers and the post-barrier layer and an indium content in the pre-quantum well, the main quantum wells and the post quantum well is constant.

7. The semiconductor layer sequence according to claim 1,
   wherein a conditioning layer is located in each case directly on both sides of the pre-quantum well and directly on both sides of the main quantum wells,
   wherein the conditioning layers are each between 1 nm and 2 nm thick, and
   wherein in each case a band gap jump between the main barrier layers and the adjoining pre-quantum well or the main quantum wells is divided into two smaller jumps by the conditioning layers.

8. The semiconductor layer sequence according to claim 7, wherein the conditioning layers have an indium gradient with an indium content increasing in a direction towards the adjoining pre-quantum well or main quantum well and/or have an aluminum gradient with an aluminum content increasing in a direction away from the adjoining pre-quantum well or main quantum well.

9. The semiconductor layer sequence according to claim 1,
   wherein the main barrier layers have a thickness of between 0.9 nm and 2.3 nm inclusive and an aluminum content between 10% and 20% inclusive, and
   wherein the precisely one pre-barrier layer has a thickness of between 2.5 nm and 4 nm inclusive and an aluminum content between 20% and 40% inclusive.

10. The semiconductor layer sequence according to claim 1,
    wherein the precisely one pre-quantum well has a thickness between 2.2 nm and 3.4 nm inclusive and an indium content between 0.5% and 6% inclusive, and
    wherein the at least four and at most 30 main quantum wells each have a thickness between 2.2 nm and 3.4 nm and an indium content between 1% and 7% inclusive.

11. The semiconductor layer sequence according to claim 1, wherein the second band gap of the main quantum wells is between 80% and 95% inclusive of the first band gap of the pre-quantum well.

12. The semiconductor layer sequence according to claim 1, wherein all pairs of main barrier layers and main quantum wells in the multi-quantum well structure are of the same design.

13. An optoelectronic semiconductor chip comprising:
    the semiconductor layer sequence of claim 1; and
    a growth substrate for the semiconductor layer sequence,
    wherein the optoelectronic semiconductor chip is configured to emit ultraviolet radiation.

14. The optoelectronic semiconductor chip according to claim 13,
    wherein the substrate is a sapphire substrate having a structured growth surface,
    wherein the semiconductor layer sequence is electrically contacted via electrical contacts, and
    wherein the semiconductor layer sequence extends over the entire substrate in a constant composition.

15. A semiconductor layer sequence comprising the following layers in the specified sequence beginning at an n-side:
    a pre-barrier layer comprising AlGaN;
    a pre-quantum well comprising InGaN having a first band gap;
    a multi-quantum well structure comprising a plurality of alternating main quantum wells of InGaN having a second band gap and main barrier layers of AlGaN or AlInGaN, wherein the second band gap is smaller than the first band gap and the main quantum wells are configured for generating a radiation having a wavelength of maximum intensity between 365 nm and 490 nm inclusive; and an electron-blocking layer comprising AlGaN, wherein a product of an aluminum content and a thickness of the pre-barrier layer is greater by at least a factor of 1.3 than a product of an aluminum content and a thickness of the main barrier layers.

16. The semiconductor layer sequence according to claim 15, wherein, in a direction away from the n-side, the multi-quantum well structure is followed by a post-quantum well with a third band gap and the third band gap is larger than the second band gap of the main quantum wells.

17. The semiconductor layer sequence according to claim 15, wherein, in a direction away from the n-side, the multi-quantum well structure is followed by a post-barrier layer comprising AlGaN or AlInGaN, and wherein a product of an aluminum content and a thickness of the post-barrier layer is greater by at least a factor of 1.3 than the product of the aluminum content and the thickness of the main barrier layers.

* * * * *